(12) United States Patent
Lazarovich et al.

(10) Patent No.: US 7,969,696 B2
(45) Date of Patent: Jun. 28, 2011

(54) GROUND FAULT DETECTION AND LOCALIZATION IN AN UNGROUNDED OR FLOATING DC ELECTRICAL SYSTEM

(75) Inventors: David Lazarovich, Thornhill (CA); Srinivasa Rao Dangeti, Razole (IN); Subodh Keshri, Mississauga (CA); Ileana Rusan, Toronto (CA); Sanjay Kumar Chaudhary, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 622 days.

(21) Appl. No.: 12/104,298

(22) Filed: Apr. 16, 2008

(65) Prior Publication Data

US 2009/0147415 A1 Jun. 11, 2009

Related U.S. Application Data

(60) Provisional application No. 60/992,752, filed on Dec. 6, 2007.

(51) Int. Cl.
*H02H 3/16* (2006.01)
*H02H 9/08* (2006.01)
(52) U.S. Cl. ................. 361/42; 361/44; 361/45
(58) Field of Classification Search .............. 361/42, 361/44, 45
See application file for complete search history.

(56) References Cited

U.S. PATENT DOCUMENTS

| 1,920,382 | A | * | 8/1933 | Griscom et al. | 307/102 |
|---|---|---|---|---|---|
| 3,292,071 | A | * | 12/1966 | McLaughlin | 320/165 |
| 4,068,275 | A | | 1/1978 | Teel et al. | |
| 5,986,860 | A | | 11/1999 | Scott | |
| 6,721,671 | B2 | | 4/2004 | Roberts | |
| 6,785,105 | B2 | | 8/2004 | Roberts et al. | |
| 7,400,150 | B2 | * | 7/2008 | Cannon | 324/522 |

FOREIGN PATENT DOCUMENTS

JP 2004-239863 * 8/2004
WO WO 2005119871 12/2005

* cited by examiner

*Primary Examiner* — Jared J Fureman
*Assistant Examiner* — Zeev Kitov
(74) *Attorney, Agent, or Firm* — Miriam Jackson, Esq.

(57) ABSTRACT

An ungrounded or floating DC electrical power distribution system may experience a single line to ground fault. Such a fault may not disrupt operation of the system, but its presence may raise a risk of additional problems if left uncorrected. A system for progressively grounding the ungrounded system may be initiated when a line to ground fault is suspected based on the voltage difference measured to a common chassis point. As grounding through successively lower impedance proceeds, fault current may increase and detection of severity of the line to ground fault may be more readily achieved, thus facilitating localization of the fault. Localization may be achieved through an analysis of direction of capacitive currents in isolatable zones of the system.

8 Claims, 8 Drawing Sheets

GROUND FAULT DETECTION AND LOCALIZATION IN AN UNGROUNDED OR FLOATING DC ELECTRICAL SYSTEM

RELATED APPLICATIONS

The present application claims benefit of U.S. Provisional Application 60/992,752 filed Dec. 6, 2007.

BACKGROUND OF THE INVENTION

The present invention generally relates to apparatus and methods for providing protection for an electrical system and, more particularly, to apparatus and methods of ground fault detection in an ungrounded electrical system.

In a grounded three phase alternating current (AC) electric power system a neutral point may be connected to ground (or chassis ground). In a grounded direct current (DC) power system, either a positive or a return conductor may be grounded. In some cases, a middle point of a DC voltage source may be grounded.

A grounded system may be grounded solidly or through some impedance. Grounding through an impedance may help in controlling a level of fault current arising out of a single line-ground fault. An ungrounded system does not have any direct connection to the ground. In other words, the grounding impedance tends to infinity.

The purpose of grounding a generator or transformer neutral is to limit a voltage rise among healthy phases when single line to ground fault occurs. It may also provide a path for zero-sequence current which may help in detection of unwanted phase to ground connection in the system.

A disadvantage of a grounded system lies in the fact that even a single line-ground fault may lead to heavy fault currents and hence disrupt operation of the entire power system. The fault has to be cleared before the grounded system resumes its normal operation. Ground faults can lead to process disruption and safety hazards such as equipment malfunctions, fire and electric shock. During a ground fault condition, power supply has to be interrupted to limit the damage to equipment.

In an ungrounded electrical power system, there may be no intentional connection between the conductors and the ground. However, in any system, stray capacitive coupling may exist between the system conductors and adjacent grounded surfaces. Consequently, an "ungrounded system" is, as a practical matter, a "capacitive grounded system" by virtue of the distributed stray capacitance.

The advantage of ungrounded system is that a single line to ground fault may have minimal fault current and hence practically no impact on the system operation. However in the event of a line-ground fault in an ungrounded system, the voltage of the healthy phases may rise to line-to-line voltage. Thus voltage stress on the healthy phase conductors may increase during fault condition. Further, there may be capacitive voltage build up if the fault is of restriking nature. Thus the phase conductors have to be insulated by design for higher voltage stress in an ungrounded system. Also, due to increased voltage stress, the probability of occurrence of second line to ground fault may increase.

Though a single line to ground fault may not impact operation of an ungrounded system, a second ground fault may lead to phase-to-phase fault, with very high fault current. In the event of such a phase-to-phase fault, power interruption is required, thus leading to system outage. It is, therefore, desirable to detect and isolate and clear the first line-ground fault as soon as possible, even though it does not affect the system operation.

A single line-ground fault in an ungrounded system may produce very small current flowing through any shunt-connected or parasitic and stray capacitances. Therefore the fault detection and in particular localization is a daunting task in a large and complex ungrounded electrical distribution network which may include multiple power sources and utilization systems. Several methods have been proposed in the prior art for single line-to-ground fault detection in ungrounded or floating networks. Most of the ground fault detection methods described in the prior art rely on measurement of positive and negative line voltage with respect to a common chassis or ground potential. During single line-to-ground condition, the faulty terminal voltage may assume ground potential while the 'healthy' phase potential may rise to the original line-to-line voltage level. Single line-to-ground fault is declared when the difference between measured voltage at the positive and the negative line with respect to common chassis exceeds a threshold value. However, these methods fail to indicate the localization of the ground fault. Since it is not desirable to shutdown the entire network in the event of a single ground fault it would be a great advantage to localize the fault and isolate only the faulty section of the network while keeping the unaffected network functions operative.

Prior-art fault localization methods may include sequential disconnection of network sections until the fault is isolated. However, this procedure leads to unnecessary disconnection of power sources or loads, disrupting the system operation.

As can be seen, there is a need for a system that may provide for early detection and isolation of single line-ground fault in an ungrounded power distribution system. Furthermore, there is a need to such a system which may provide both detection and localization of a faulted network section.

SUMMARY OF THE PRESENT INVENTION

In one aspect of the present invention an electrical power distribution system comprises at least one power distribution zone. The at least one zone has at least two test points positioned at separate locations in the zone. Each of the at least two test points is capable of measuring a direction of capacitive current. The at least one power distribution zone is electrically isolatable from the power distribution system responsively to a presence of capacitive current at one of the test points being opposite in direction from capacitive current at the other test point.

In a further aspect of the invention a ground fault localization system for an ungrounded power distribution system comprises at least two sensors for measuring direction of capacitive current in a conductor of the power distribution system. At least one isolating device for isolating the conductor from the power distribution system responsively to a determination by that direction of capacitive current at a first one of the at least two sensors is opposite to direction of capacitive current at a second one the sensors.

In another aspect of the invention a method of localizing a ground fault in an ungrounded electrical power distribution system comprises the steps of sensing direction of capacitive currents at two separate testing points of a zone of the distribution system and declaring the zone to have a ground fault upon determination that the capacitive currents are in opposite directions.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention provides a system for detection and isolation of ground faults in an ungrounded or floating DC electrical power distribution system or network.

The inventive system may gradually ground an ungrounded system in a controlled manner for early detection and isolation of a single line-ground fault. Additionally the inventive system may provide localization of a single ground fault in a complex floating network. The invention may be useful in any ungrounded commercial power system and more particularly in aerospace electrical power system application.

In contrast to the prior art, which may use sequential disconnection of network sections to isolate a fault, the present invention may preclude unnecessary disconnection of power sources or loads and the resultant disruption of system operation. In the event of detection of a line-ground fault, a circuit path to ground may be produced through a collection of sequentially switched resistors. Ground fault current may then increase and localization of the ground fault may be more readily achieved. Capacitive currents and their respective directions may be measured. Data obtained in such measurements may be used to determine a zone of a network in which a fault may exist.

Figure 1:
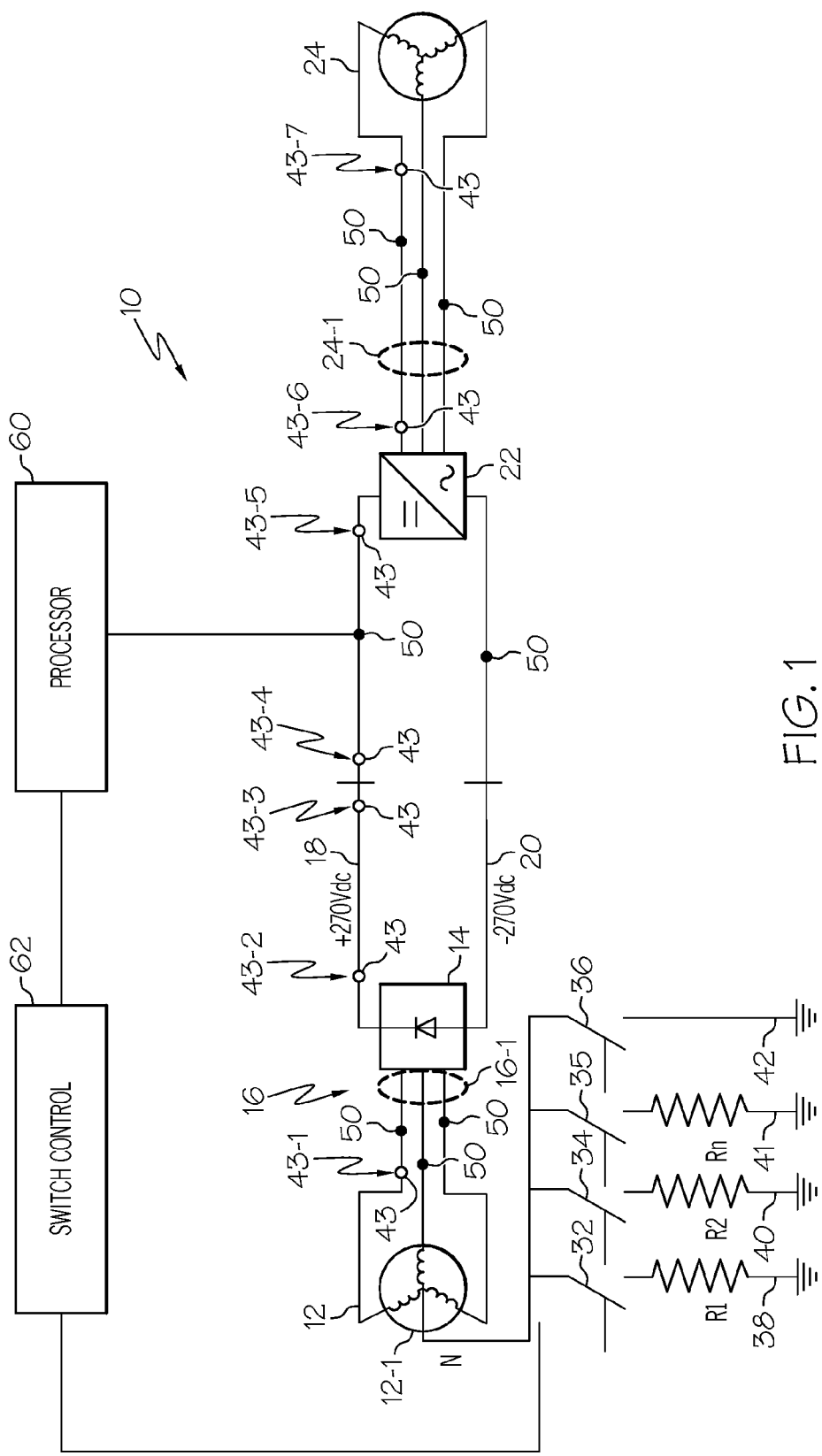
FIG. 1 is a block diagram of an electrical power distribution system in accordance with the invention.

Referring now to FIG. 1 there is shown a simplified form of a typical commercial or aerospace ungrounded power system 10. The power system 10 may comprise a three-phase synchronous generator 12 connected to a rectifier 14. The generator 12 and the rectifier 14 may be collectively referred to as a DC generator 16. Power distribution may take place through DC feeders 18 and 20. Power transmission in the system 10 may be considered to be two-wire DC floating power transmission. At suitable points, inverters may used to convert the DC electric power from the feeders 18 and 20 into AC power of desired voltage and frequency. In an illustrative embodiment of FIG. 1, one inverter 22 may be connected to the feeders 18 and 20. It should be understood that the system 10 may comprise more than one of the inverters 22 and more than one of the DC generators 16. One or more three-phase AC loads 24 may be connected to the inverter 22 through phase conductors 24-1.

A neutral point 12-1 of the generator 12 may be connectable to ground through controlled switches 32, 34 and 36 and ground conduction paths 38, 40 and 42. While the system 10 may operate normally as an ungrounded system, controlled switches 32, 34 and 40 may be used to progressively ground the system 10 when and if a single line-ground fault may develop. As grounding impedance decreases, fault current may increase correspondingly and the fault may thus be more readily detected and isolated.

In an illustrative embodiment of FIG. 1, three conduction paths 38, 40 and 42 are shown. Conduction paths 38 and 40 may comprise resistors R1 and R2 respectively. Conduction path 42 may comprise a solid grounding connection, i.e., a conduction path with zero impedance. Thus the embodiment of FIG. 1 may be considered to have three stages of progressive grounding. However, depending upon system requirements, "n" stages of resistors may be used to give a smooth transition from ungrounded to grounded system. Also, pulse width modulation (PWM) switching of resistors may be employed to provide progressive resistance variation that is smooth.

It may be noted that a single line-ground fault in an ungrounded AC system may produce very small current flowing through shunt-connected or any parasitic and stray capacitances. In an ungrounded DC system, the fault current may be characterized by transient capacitive current of shunt capacitance. However, in either system the faulted phase may come to ground potential, while voltages in non-faulted phases may rise to line-voltage levels.

As shown in FIG. 1, three-phase currents and voltages (with respect to ground) may be measured at testing points 43-1, 43-6 and 43-7 in the AC phase conductors 16-1 of the DC generator 16 and the phase conductors 24-1 which may be connected to the three phase load 24. In the DC feeders 18 and 20, line voltages (with respect to the ground) and currents may measured at testing points 43-2, 43-3, 43-4 and 43-5. Data from the test points may be transmitted continually to a processor 60. It may be noted that, for purposes of simplicity, FIG. 1 shows the processor 60 being connected to only one of the sensors 43. In an actual embodiment of the invention, all of the sensors 43 may be connected with the processor 60.

The resistances R1 and R2 may be selected so as to limit fault current through the neutral point 12-1 to specified values. A sufficiently high value may be chosen for R1, such that the fault current through the neutral point 12-1 may be limited to a maximum specified limit. If a fault were to develop at a location far from the DC generator 16 or through some high impedance, a high value of R1 may restrict the fault current through the neutral point 12-1 to an insignificant level. In such cases, this fault current may be increased by closing the switch 34, which may connect the neutral point 12-1 to ground through a lower resistance R2.

The resistances R1 and R2 may be selected such that differential current sensors 50 around the fault may provide current differential signal to the processor 60. The values of R1 and R2 may be selected to suit a particular configuration of the system 10. In general, R2 may be about one-tenth of R1. It may be noted that, for purposes of simplicity, FIG. 1 shows the processor 60 being connected to only one of the differential current sensors 50. In an actual embodiment of the invention, all of the differential current sensors 50 may be connected with the processor 60.

Once a line-ground fault is suspected by observing some line potential coming close to ground potential or abnormal voltages at any one or more of the test points, switch 32 may be closed e.g., through activation by a switching system or switching controller 62 that may be responsive to the processor 60. The neutral point 12-1 of the generator 12 may be thus grounded through a high resistance, R1. The resistance, R1 may be selected such that in a worst case fault situation, the resultant fault current through the resistor R1 is no higher than about one (1) ampere (A) to about five (5) A.

If the resultant fault current is found to be very small and fault localization appears to be difficult, then the second switch 34 may be closed. This may connect the neutral point 12-1 with ground through the resistance R2. The switch 32 may be left closed or it may be opened before closing the switch 34. If there is no rise in neutral current, even after closing the switches 32 and 34, the switch 36 may be closed. This may connect the generator neutral point 12-1 to ground with a zero impedance connection.

If current at the neutral point 12-1 were to remain non-significant, then the system 10 could be declared free from faults. When the system 10 becomes grounded and an appreciable amount of fault current flows in the system 10, the current sensors 50 may pick up the fault current.

The illustrative embodiment of the system 10 is described as one that employs switched resistance grounding. In this illustrative embodiment the grounding resistors R1, R2 ... Rn may be changed in fixed steps as switches are closed and/or opened by the switching controller 62. As described above, PWM controlled switching of the resistors R1, R2 ... Rn may be employed so that resistance variation is continuous and smooth. In other words, the switching controller 62 may be a PWM-based controller. PWM control of switching may be readily implemented with switches such as metal oxide field effect transistors (MOSFET's) or insulated gate bipolar transistors (IGBT's) or as a pair of back-back connected thyristors.

Figure 2:
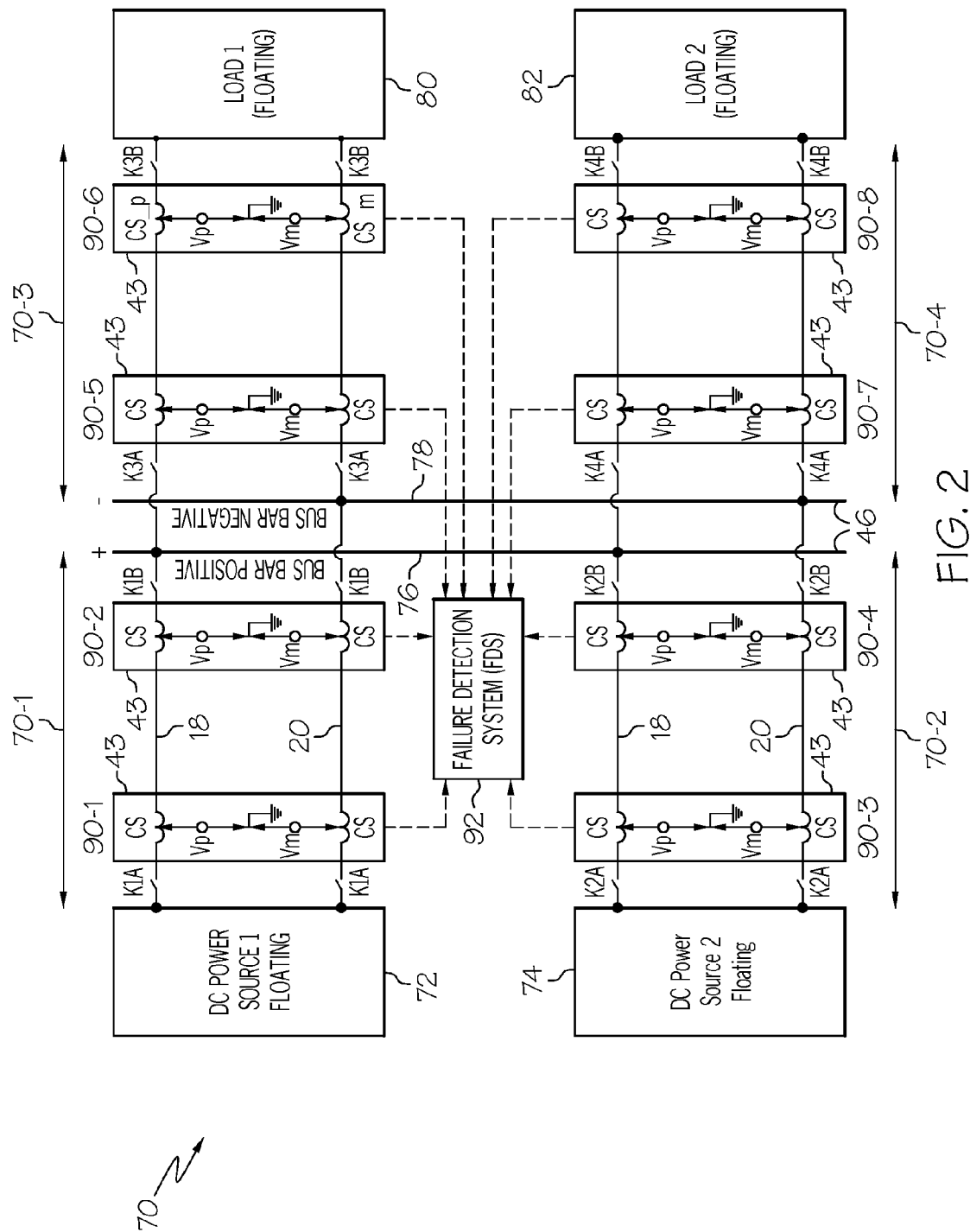
FIG. 2 is a block diagram of a DC portion of the power distribution system of FIG. 1 in accordance with the invention.

Localization of a single line-ground fault in a floating DC network may be achieved in a manner depicted by reference to FIG. 2. In FIG. 2, an illustrative ungrounded or floating DC electrical network 70 is depicted. The DC network 70 may comprise a portion of the power distribution system 10 of FIG. 1. Ungrounded DC source 72 and source 74 may be connected to a positive DC bus-bar 76 via the generator feeder 18. The ungrounded DC sources 72 and 74 may be connected to a negative DC bus-bar 78 via the generator feeder 20. The DC source 72 and 74 may be a floating battery system, a DC generator or an AC generator followed by a rectifier system. In the illustrative embodiment of FIG. 2, two loads 80 and 82 are shown connected to the DC bus bar 76 and 78 through the feeders 18 and 20. It may be understood that there could be any number of DC sources and any number of loads connected to the DC bus-bars 76 and 78.

For illustrative purposes, four zones may be defined in network 70 A zone 70-1 may be defined between floating DC power source 72 and the bus bars 76 and 78. A zone 70-2 may be defined between floating DC power source 74 and the bus bars 76 and 78. A zone 70-3 may be defined between bus bars 76 and 78 and the load 80. A zone 70-4 may be defined between bus bar 76 and 78 and the load 82.

Each of the zones 70-1, 70-2, 70-3 and 70-4 may have two of the sensors 43 installed for fault detection. In zone 70-1, line voltages (with respect to the ground) and currents may be measured at test points indicated by the numerals 90-1 and 90-2. In zone 70-2, line voltages (with respect to the ground) and currents may be measured at test points indicated by the numerals 90-3 and 90-4 In zone 70-3, line voltages (with respect to the ground) and currents may be measured at test points indicated by the numerals 90-5 and 90-6. In zone 70-4, line voltages (with respect to the ground) and currents may be measured at test points indicated by the numerals 90-7 and 90-8. The sensors 43 may be interconnected with a fault detection system 92, which may be, in an illustrative embodiment, a portion of the processor 60 of FIG. 1.

A detected ground fault in zone 70-1 may be isolated by opening isolating devices such as contactor sets K1A and K1B. Similarly, ground fault in zone 70-2 may be isolated by opening both contactor set K2A and contactor set K2B. Ground fault in zone 70-3 may be isolated by opening both contactor set K3A and contactor set K3B. Ground fault in zone 70-4 may be isolated by opening both contactor set K4A and contactor set K4B.

During a ground fault condition, it may be desirable to localize and isolate only the faulted zone while keeping other zones in normal operation. For example, if a ground fault were to be detected in zone 70-1 it may be desired to isolate only zone 70-1, by opening both contactor set K1A and contactor set K1B. In this scenario the loads 80 and 82 may be fed from DC power source 74. Similarly if a fault develops in zone 70-4 then only zone 70-4 may be isolated from the network 70 In that case, the DC power sources 72 and 74 and the load 80 may remain connected to the network 70.

As described above, a single line-ground fault condition may be declared if a difference between measured positive voltage (Vp) and negative voltage (Vn) with respect to ground or a common chassis exceeds a threshold value. However, in the case of a line to ground failure, all of the test points may measure a voltage difference with respect to ground or a common chassis. This may be indicative of presence of a ground fault somewhere in the power system network 70. But, localization of such a fault may not achieved merely by measurement of Vp and Vn.

Localization of a fault may be achieved by considering that shunt or stray capacitance may exist between ground and positive and negative conductors throughout the network 70. Fault current during single line-ground fault may be characterized by the transient capacitive current through the shunt or stray capacitance. This current may be referred to as capacitive current.

The capacitive current during a single line-ground fault may be characterized by equation (1) below $$Ic = C*dV/dt \qquad (1)$$

where Ic=capacitive current;
C=shunt or stray capacitance; and
V=line voltage

Current at each of the test points may be measured and analyzed continuously on fault detection system (FDS) 92. The FDS 92 may comprise a software module which may run on a common micro-controller or DSP (Digital Signal Processing) platform such as the processor 60 of FIG. 1. Current signals may be processed and analyzed continuously to detect presence and direction of any capacitive current direction at each test point during fault condition. To avoid nuisance capacitive current detection during intermittent fault condition, voltage signals from at least one test point may also be analyzed for ground fault confirmation.

In the present invention, ground fault in the floating DC network 70 may be localized based on the detection of direction of capacitive current. If the same direction of the capacitive current is measured at both of the test points in a particular one of the zones, then ground fault is declared outside that zone. If, on the other hand, opposite direction of capacitive current is measured at the two test points, then ground fault is declared within that particular zone. For example, consider if a single line to ground fault were to occur in zone 70-3 between positive feeder 18 and ground. The direction of the capacitive current measured between a positive terminal of test point 90-3 and a positive terminal of test point 90-6 would indicate opposite direction of capacitive current, i.e. an opposite signature. The analyzed current signal at test point 90-3 may show a positive direction while a current signal at test point 90-6 may indicate negative charging direction. Sampled current signals at other test points in zone 70-1, zone 70-2 and zone 70-4 may indicate capacitive current directions that are the same direction. So based the above fault signature the single line-to-ground fault could be localized in zone 70-3.

Referring now to FIGS. 3 through 7 and back to FIG. 2, simulation results produced in a Matlab/Simulink™ environment are shown. A simulated single line-to-ground fault may be injected in zone 70-3. Line to ground stray capacitance may be simulated as a lumped parameter.

Figure 3:
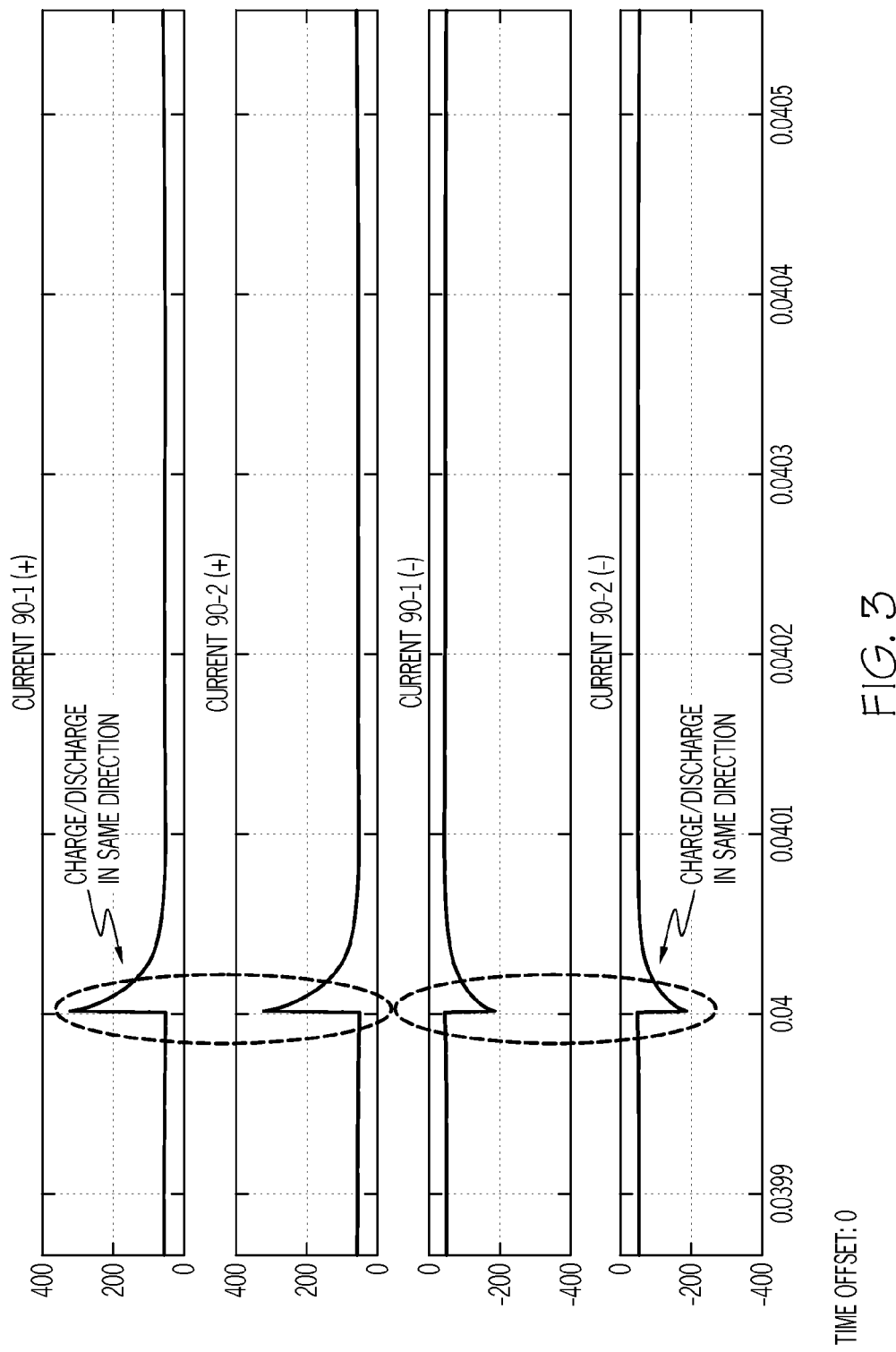
FIG. 3 is a graph portraying a relationship of capacitive current directions in a first portion of the system of FIG. 1 in accordance with the invention.
Figure 4:
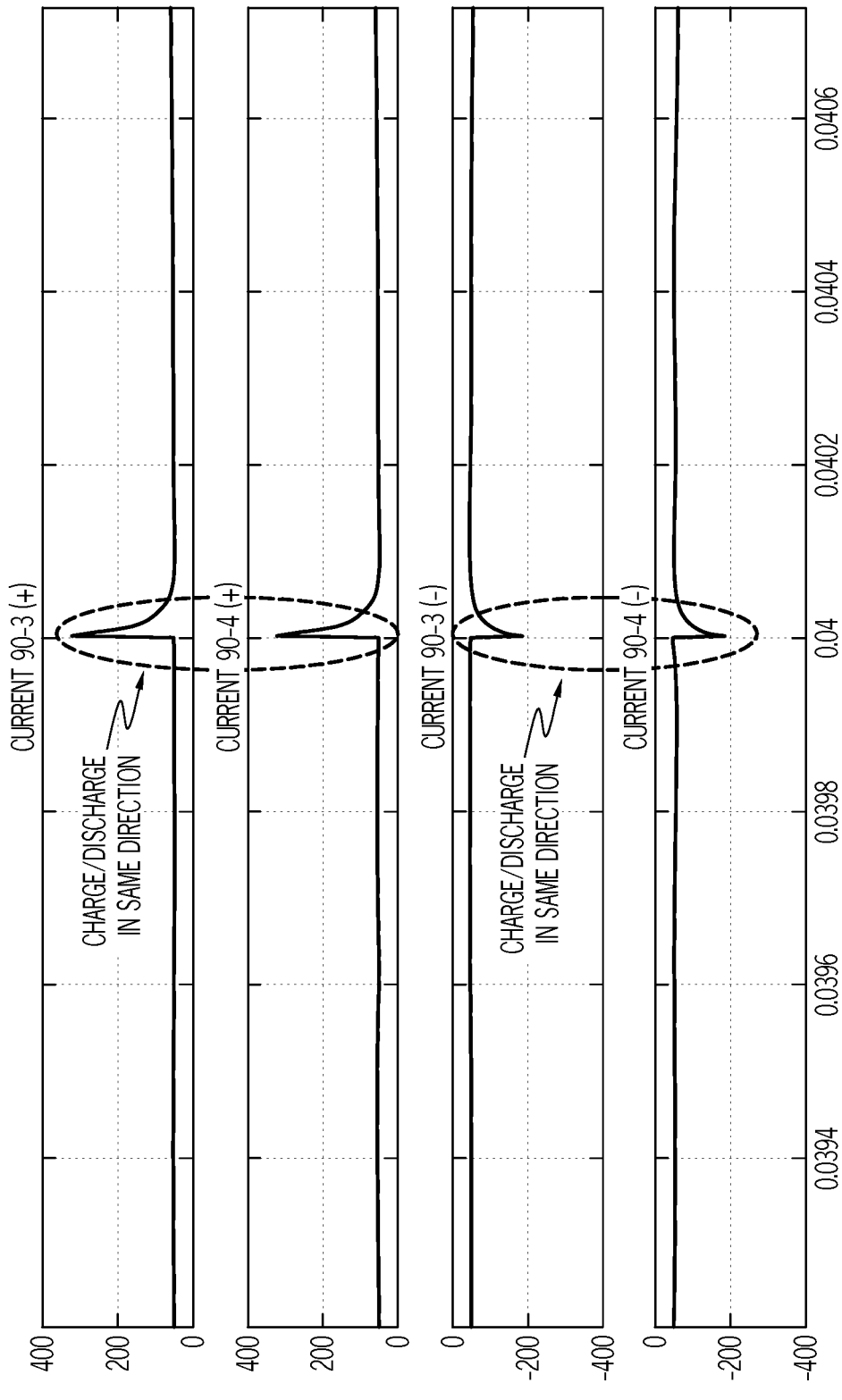
FIG. 4 is a graph portraying a relationship of capacitive current directions a second portion of the system of FIG. 1 in accordance with the invention.
Figure 5:
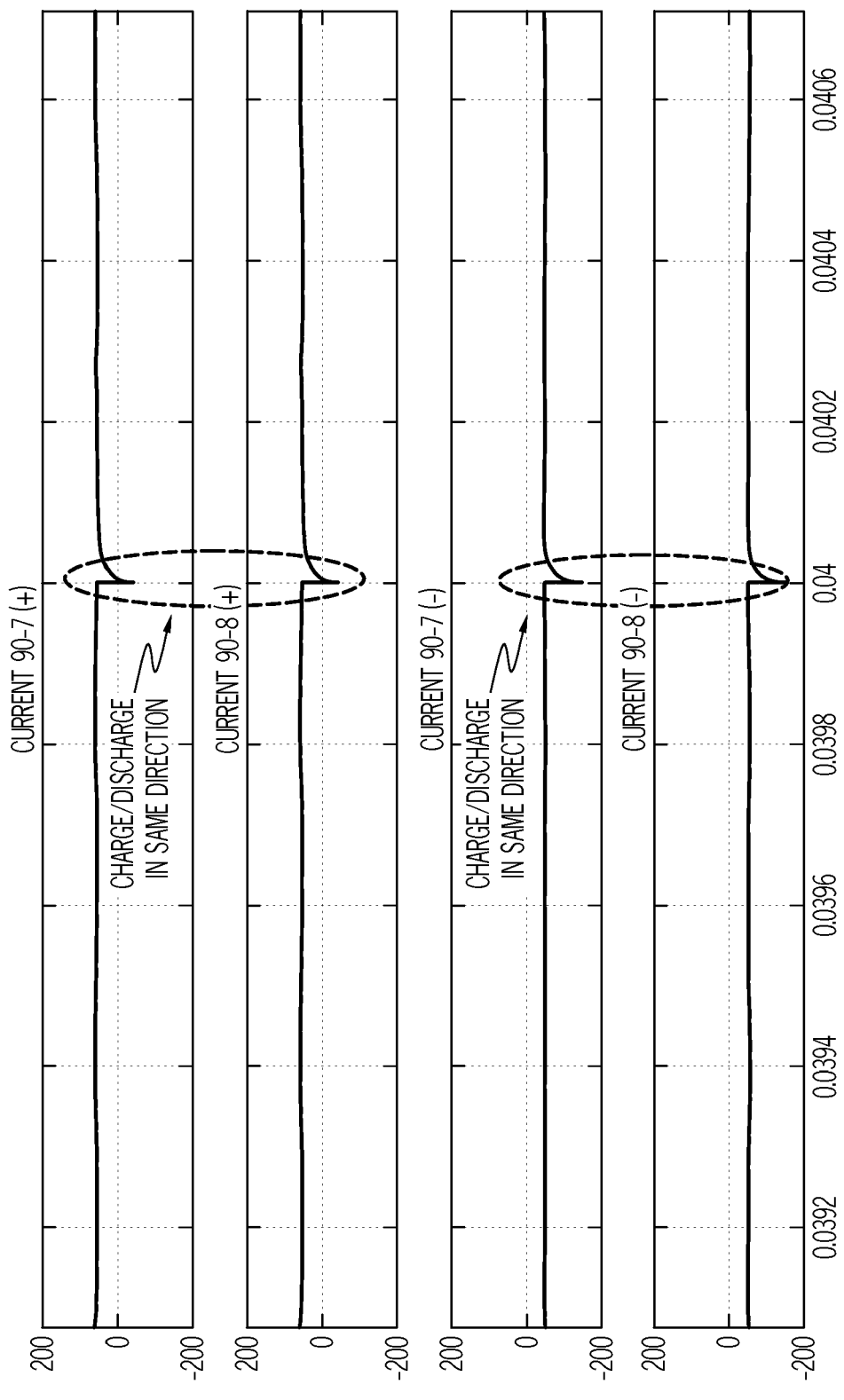
FIG. 5 is a graph portraying a relationship of capacitive current directions a third portion of the system of FIG. 1 in accordance with the invention.

The simulation result indicates that the capacitive current direction measured at test points 90-1 and 90-2 are the same (see FIG. 3). Capacitive current direction measured at test points 90-3 and 90-4 are the same (see FIG. 4). Capacitive current direction measured at test points 90-7 and 90-8 are the same (see FIG. 5) This confirms that the ground fault lies outside zone 70-1, zone 70-2 and zone 70-4.

Figure 6:
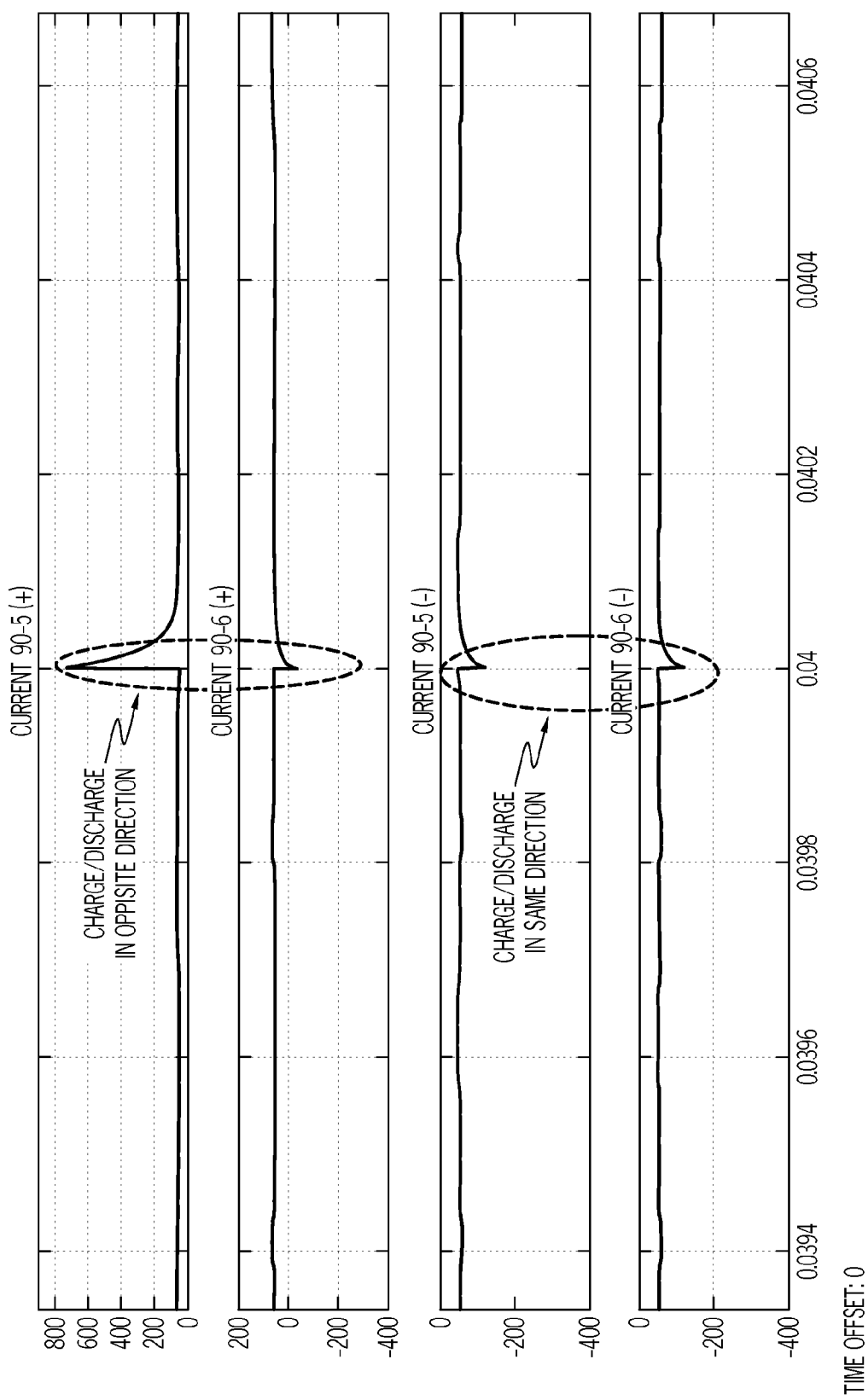
FIG. 6 is a graph portraying a relationship of capacitive current directions a fourth portion of the system of FIG. 1 in accordance with the invention.
Figure 7:
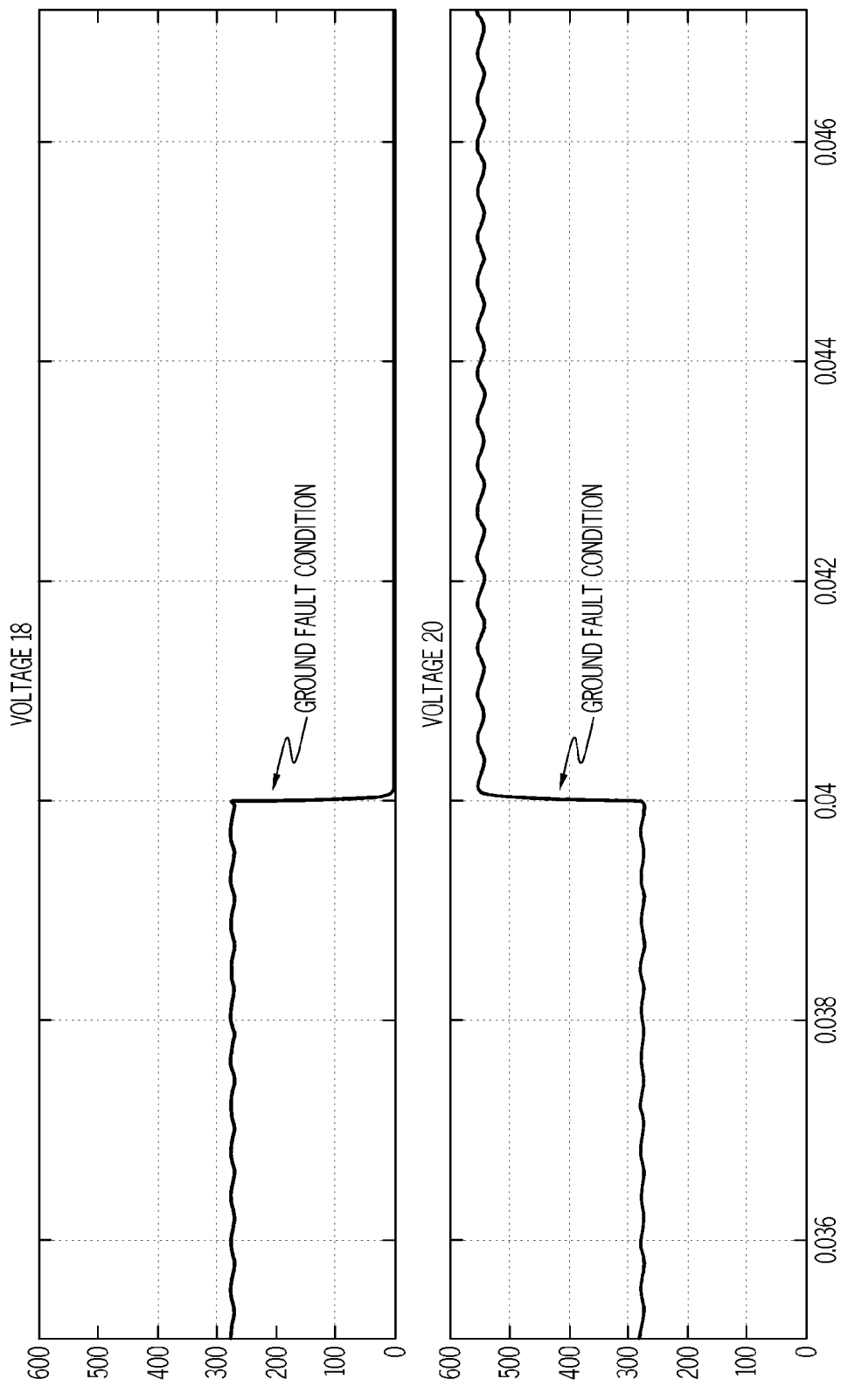
FIG. 7 is graph portraying a relationship of line voltage to ground in accordance with the invention.

But the capacitive current direction measured at test points 90-5 and 90-6 shows opposite direction (see FIG. 6). So the current signal analysis confirms fault location within zone 70-3. As described above, a single line-ground fault condition may be declared if a difference between measured positive voltage (Vp) and negative voltage (Vn) with respect to ground or a common chassis exceeds a threshold value. As shown in FIG. 7, there is a change that may exceed a predetermined threshold value in voltage measurement between line-to-ground or chassis. This may confirm that a ground fault does exist in the floating DC electrical network 70.

Figure 8:
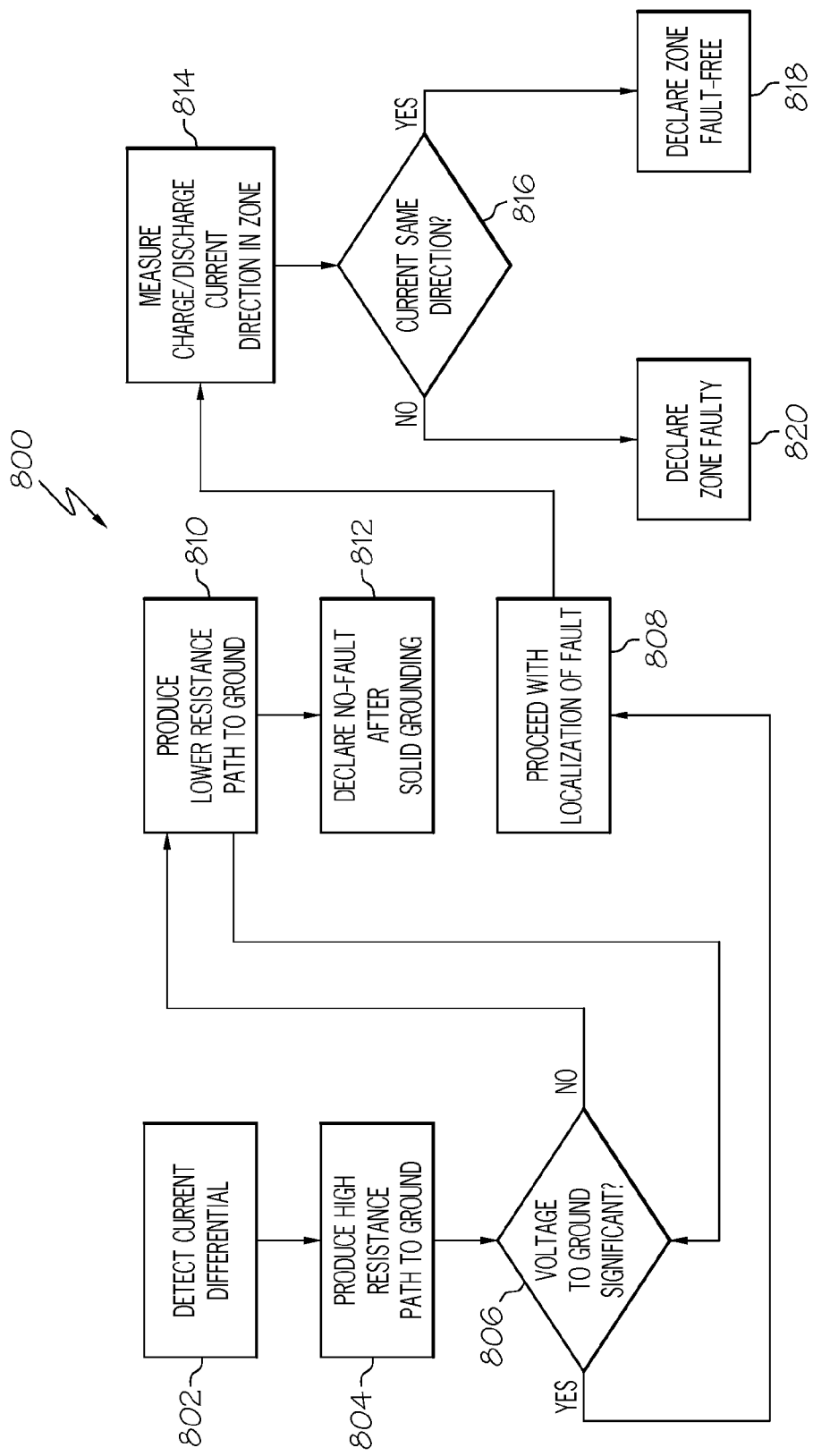
FIG. 8 is a flow chart of a method for localizing ground faults in accordance.

Referring now to FIG. 8, which is a flow chart, it may be seen that the present invention also envisions a method 800 of detecting a single line-ground fault in an ungrounded electrical distribution system. In a step 802, DC bus voltage with respect to common chassis may be detected (e.g., one of the test points may provide a potential fault signal to the processor 60). In a step 804, a high resistance path to ground may be produced (e.g., the neutral point 12-1 may be connected to ground through the resistor R1). In a step 806, determination may be made as to whether the detected voltage increases significantly (e.g., one of the test points may provide an updated voltage signal to the processor which may be compared with a previous voltage signal).

If voltage increase is significant, a step 808 may be performed in which localization of a fault may proceed in a step 814 (e.g., the processor 60 may provide location identifying information as described hereinbelow). If a voltage increase is not significant, a step 810 may be performed in which a lower resistance path to ground may be produced (e.g., the neutral point 12-1 may be connected to ground through successively lower impedances, resistors R2 . . . Rn). Steps 806 and 810 may be cyclically repeated until either a solid path to ground is established or a significant current increase is found. In the event of finding no significant current increase in step 806 after a solid ground is produced in step 810, a step 812 is initiated in which a declaration of no-fault is made.

In a step 814, which may be initiated after step 808, capacitor charge or discharge current (capacitive current) direction may be measured within a network zone (e.g. sensor 43 at test point 90-1 and 90-2 may determine direction of capacitive current at both of the test points). In a step 816, the current directions may be compared. In the event that capacitive current for both of the test points are in the same direction then a step 818 may be initiated to declare that the zone is fault-free. In the event that capacitive currents are determined to be in opposite directions in step 816, a step 820 may be initiated in which a zone may be declared to contain a ground fault.

The method 800 may be performed continuously and repetitively so that the ungrounded electrical system may be continuously monitored to determine if a single line-ground fault may exist It should be understood, of course, that the foregoing relates to exemplary embodiments of the invention and that modifications may be made without departing from the spirit and scope of the invention as set forth in the following claims.

We claim:

1. An electrical power distribution system comprising:
   at least one power distribution zone; and
   at least two test points positioned at separate locations in the zone;
   each of the at least two test points being capable of measuring a direction of capacitive current;
   the at least one power distribution zone being electrically isolatable from the power distribution system responsively to a presence of capacitive current at one of the test points being opposite in direction from capacitive current at the other test point; and
   the at least two test points being interconnected with a progressive pulse width modulation (PWM) based switching system for grounding the power distribution system from an ungrounded state sequentially through a first conductive path having a first resistance and a second conductive path having a second resistance lower than the first resistance.

2. The electrical power distribution system of claim 1 further comprising:
   at least two of the zones; and
   the zones being electrically isolatable from each other responsively to determination of direction of capacitive current at their respective test points.

3. The electrical power distribution system of claim 1 wherein at least one of the zones is isolated from the power distribution system in a presence of a fault current increase after the second conductive path is connected to the power distribution system.

4. A ground fault localization system for an ungrounded power distribution system comprising:
   at least two sensors for measuring direction of capacitive current in a conductor of the power distribution system; and
   at least one isolating device for isolating the conductor from the power distribution system responsively to a determination that direction of capacitive current at a first one of the at least two sensors is opposite to direction of capacitive current at a second one the at least two sensors;
   a fault detection system connected to each of the at least two sensors; and
   a progressive grounding system for the power distribution system;
   wherein the progressive grounding system comprises:

a plurality of resistors selectively connectable between the power distribution system and ground potential;

a solid conductive path between the power distribution system and ground; and a pulse width modulation (PWM) based switching system that successively decreases resistance of a conductive path between the power distribution system and ground.

5. A method of localizing a ground fault in an ungrounded electrical power distribution system comprising the steps of:

sensing direction of capacitive currents at two separate testing points of a zone of the distribution system;

declaring the zone to have a ground fault upon determination that the capacitive currents at each of the two separate testing points are in opposite directions.

progressively grounding the power distribution system by successively connecting the power distribution system to at least two conduction paths to ground wherein a first path has a higher resistance than a second path; and determining that a ground fault exists in the power distribution system won determination that ground fault current increases after introducing the second conductive path to ground.

6. The method of claim 5 further comprising the step of declaring the zone to be fault-free upon determination that the capacitive currents at each of the two separate testing points are in the same direction.

7. The method of claim 5 wherein the steps of sensing capacitive current and progressively grounding the power distribution system are performed continually to monitor the power distribution system.

8. The method of claim 7, wherein the step of progressively grounding the power distribution system is performed by PWM switching.

\* \* \* \* \*